(12) United States Patent
Cucchi et al.

(10) Patent No.: US 12,074,612 B2
(45) Date of Patent: Aug. 27, 2024

(54) REDUCED-POWER IMPLEMENTATION OF ERROR-CORRECTION PROCESSING

(71) Applicant: Nokia Solutions and Networks Oy, Espoo (FI)

(72) Inventors: Daniele Cucchi, Milan (IT); Davide Cattaneo, Seregno (IT); Luca Gabriele Razzetti, Sesto San Giovanni (IT); Carlo Constantini, Casatenovo (IT); Giancarlo Gavioli, Usmate Velate (IT)

(73) Assignee: Nokia Solutions and Networks Oy, Espoo (FI)

( * ) Notice: Subject to any disclaimer, the term of this patent is extended or adjusted under 35 U.S.C. 154(b) by 33 days.

(21) Appl. No.: 18/158,720

(22) Filed: Jan. 24, 2023

(65) Prior Publication Data
US 2023/0238983 A1     Jul. 27, 2023

(30) Foreign Application Priority Data

Jan. 25, 2022  (EP) .................................... 22153102

(51) Int. Cl.
*H03M 13/11*   (2006.01)
*H03M 13/00*   (2006.01)
*H03M 13/37*   (2006.01)

(52) U.S. Cl.
CPC .... *H03M 13/1125* (2013.01); *H03M 13/1108* (2013.01); *H03M 13/1111* (2013.01); *H03M 13/3723* (2013.01); *H03M 13/6502* (2013.01)

(58) Field of Classification Search
CPC ........ H03M 13/1125; H03M 13/1108; H03M 13/1111; H03M 13/3723; H03M 13/6502

USPC ................ 714/758, 752; 370/216, 241, 242; 375/224; 455/67.14
See application file for complete search history.

(56) References Cited

U.S. PATENT DOCUMENTS

| | | | |
|---|---|---|---|
| 8,799,742 B1 * | 8/2014 | Zhang | H03M 13/451 |
| | | | 714/759 |
| 11,616,634 B1 * | 3/2023 | Naim | H03M 13/255 |
| | | | 375/131 |
| 2004/0148561 A1 * | 7/2004 | Shen | H03M 13/3738 |
| | | | 714/803 |

(Continued)

OTHER PUBLICATIONS

Le et al., A Probabilistic Parallel Bit-Flipping Decoder for Low-Density Parity-Check Codes, Sep. 25, 2018, HAL Open Science, pp. 1-14. (Year: 2018).*

(Continued)

*Primary Examiner* — John J Tabone, Jr.
(74) *Attorney, Agent, or Firm* — Stratford Group Ltd.

(57) ABSTRACT

A low-density parity-check (LDPC) decoder comprising a pre-processor, a core decoder, and a post-processor. The pre-processor is configured to transform a received log-likelihood-ratio (LLR) sequence into a form that enables the core decoder to toggle at a reduced rate during iterative decoding processing thereof. Upon stoppage of the decoding processing corresponding to the LLR sequence, the post-processor operates to apply a complementary transformation to the output of the core decoder, which recovers the corresponding codeword of the LDPC code. An example embodiment of the LDPC decoder operating in this manner may be able to beneficially reduce the power consumption therein by about 10%.

19 Claims, 8 Drawing Sheets

(56) References Cited

U.S. PATENT DOCUMENTS

| | | | |
|---|---|---|---|
| 2011/0058631 A1* | 3/2011 | Tan | H04L 1/0045 |
| | | | 375/340 |
| 2016/0006543 A1 | 1/2016 | Winstead et al. | |
| 2018/0123614 A1* | 5/2018 | Loncke | H03M 13/1188 |
| 2018/0175889 A1 | 6/2018 | Bazarsky et al. | |
| 2020/0235757 A1 | 7/2020 | Achtenberg et al. | |
| 2022/0255565 A1* | 8/2022 | Sunwoo | H03M 13/3753 |
| 2022/0329350 A1* | 10/2022 | Sunwoo | H04L 1/0057 |
| 2023/0084339 A1* | 3/2023 | Sunwoo | H03M 13/1108 |
| 2023/0238983 A1* | 7/2023 | Cucchi | H03M 13/1108 |
| | | | 714/758 |

OTHER PUBLICATIONS

EP Search Report issued for corresponding EP Application No. 22153102.3 dated Jun. 22, 2022.

* cited by examiner

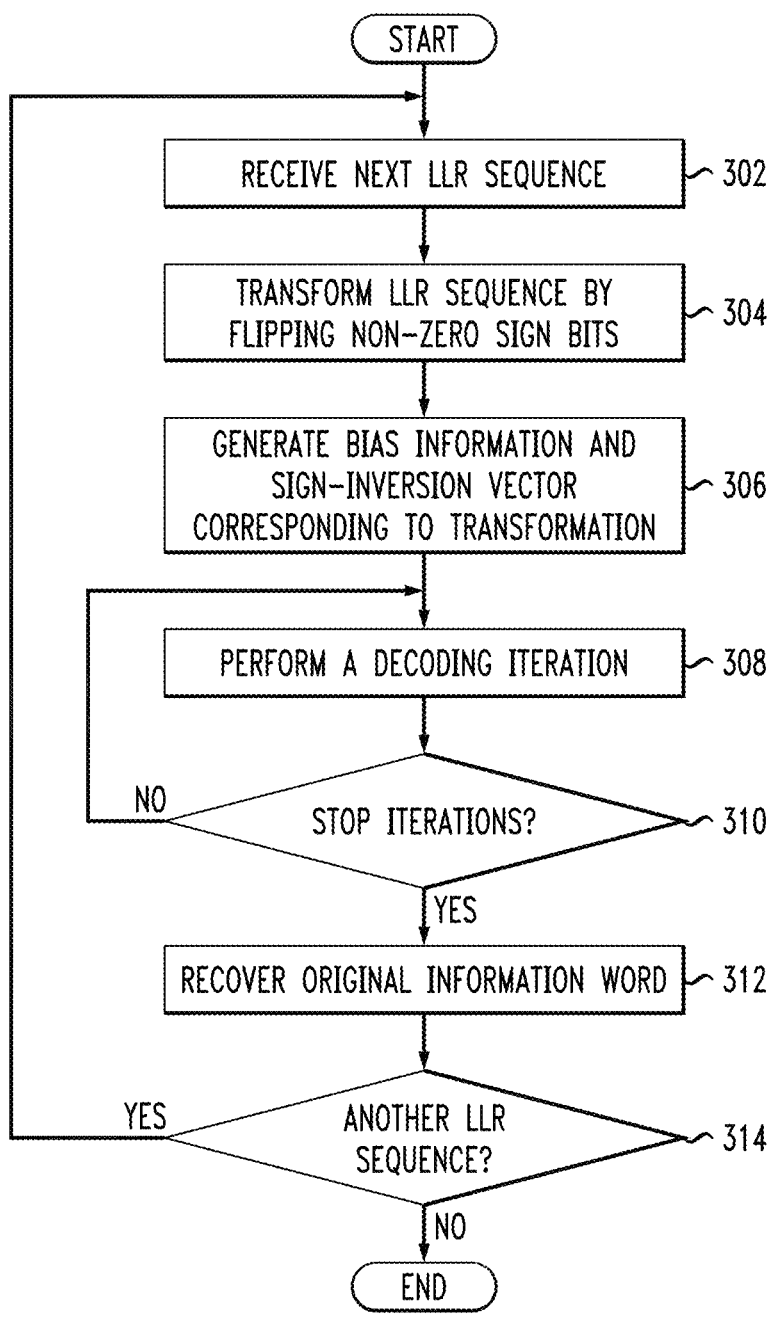

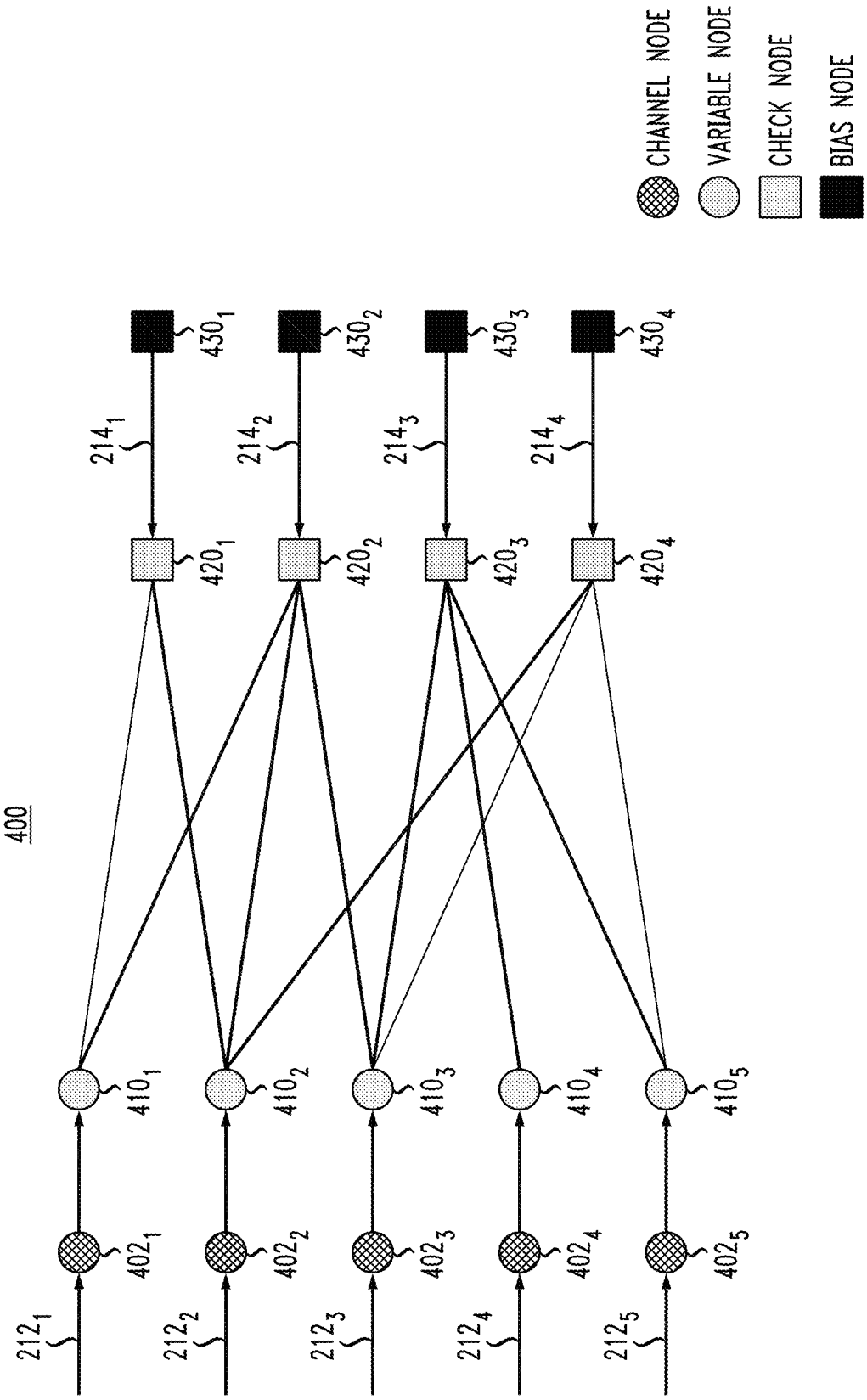

FIG. 5A

NOTATION $DT_i^{in}$ : algorithm input for the i-th bit (LLR)

$DT_i^{out}$ : algorithm output for the i-th bit (decision)

N : codeword length

M : number of parity equations $VI(k)$ : indices of variables that contribute to the k-th parity check $VI(k,h)$: $VI(k)$, wherein index h is excluded $CI(k)$ : indices of parity checks that contain the k-th variable $CI(k,h)$: $CI(k)$, wherein index h is excluded $LLR_i^{in}$ : initial LLR input to the i-th variable node $M_{i,j}^{vc}$ : message from i-th variable node to j-th check node $\underline{M}_{VI(j),j}^{vc}$ : messages to the j-th check node from all variable nodes connected thereto $\underline{M}_{VI(j,i),j}^{vc}$ : messages to the j-th check node from all variable nodes connected thereto, except for the i-th variable node $M_{j,i}^{cv}$ : message from the j-th check node to the i-th variable node $\underline{M}_{CI(i),i}^{cv}$ : messages to the i-th variable node from all check nodes corresponding to $CI(i)$ $\underline{M}_{CI(i,j),i}^{cv}$ : messages to the i-th variable node from all check nodes corresponding to $CI(i,j)$ B : M-component bias vector for parity checks S : N-component sign inversion vector D : N-component decision vector

FUNCTIONS:

a) $F^{vc}$, running on variable nodes, to update messages from variable nodes to check nodes
$$M_{i,j}^{vc} = F^{vc}\left(LLR_i^{in}, \underline{M}_{CI(i,j),i}^{cv}\right)$$

b) $\tilde{F}^{cv}$, running on check nodes, to update messages from check nodes to variable nodes
$$M_{j,i}^{cv} = \tilde{F}^{cv}(\underline{M}_{VI(j,i),j}^{vc}, B(j)) = F^{cv}(\underline{M}_{VI(j,i),j}^{vc}) \cdot (-1^{B(j)})$$
where $F^{cv}$ is a conventional update function c) $F^{out}$, running on variable nodes, to update output LLRs thereat
$$LLR_i^{out} = F^{out}(LLR_i^{in}, \underline{M}_{CI(i),i}^{cv})$$

d) $F^d$, applied to output LLRs, to generate the hard decision
$$D_i = F^d\left(LLR_i^{out}\right)$$

EXAMPLE EXPRESSIONS FOR FUNCTIONS:

- $M_{i,j}^{vc} = LLR_i^{in} + \Sigma_{k \in CI(i,j)} M_{i,k}^{vc}$     (a)
- [implementation specific]     (b)
- $LLR_i^{out} = LLR_i^{in} + \Sigma_{k \in CI(i)} M_{k,i}^{cv}$     (c)
- $D_i = \begin{cases} LLR_i^{out} \geq 0 => D_i = 0 \\ LLR_i^{out} < 0 => D_i = 1 \end{cases}$     (d)

```
501:    for i = 0 : N - 1
502:        if(DT_i^{in} < 0)
503:            LLR_i^{in} = -DT_i^{in}
504:        else
505:            LLR_i^{in} = DT_i^{in}
506:    for i = 0 : N - 1
507:        for j = 0 : M - 1
508:            M_{i,j}^{vc} = 0
509:            M_{j,i}^{cv} = 0
510:    B(0 : M - 1) = 0
511:    for i = 0 : N - 1
512:        if(DT_i^{in} < 0)
513:            S(i) = 1
514:            for j∈CI(i)
515:                B(j) = B(j) xor 1
516:        else
517:            S(i) = 0
```

FIG. 5C

| 520: | for $i = 0 : N - 1$ |
|---|---|
| 521: |    for $j = 0 : M - 1$ |
| 522: |       $M_{i,j}^{vc} = F^{vc}(LLR_i^{in}, \underline{M}_{CI(i,j),i}^{cv})$ |
| 523: |    for $j = 0 : M - 1$ |
| 524: |       for $i = 0 : N - 1$ |
| 525: |          $M_{j,i}^{cv} = \tilde{F}^{cv}(\underline{M}_{VI(j,i),j}^{vc}, B(j))$ |
| 526: |    for $i = 0 : N - 1$ |
| 527: |       $LLR_i^{out} = F^{out}(LLR_i^{in}, \underline{M}_{C(i),i}^{vc})$ |
| 528: |       $DT_i^{out} = F^d(LLR_i^{out})$ |

FIG. 5D

| 530: | for $i = 0 : N - 1$ |
|---|---|
| 531: |    $DT_i^{out} = D_i \text{ xor } S_i$ |

REDUCED-POWER IMPLEMENTATION OF ERROR-CORRECTION PROCESSING

BACKGROUND

Field

Various example embodiments relate to communication equipment and, more specifically but not exclusively, to error-correction processing in optical communications.

Description of the Related Art

This section introduces aspects that may help facilitate a better understanding of the disclosure. Accordingly, the statements of this section are to be read in this light and are not to be understood as admissions about what is in the prior art or what is not in the prior art.

In computing, information theory, and coding theory, an error-correction code (ECC) is a code according to which a data signal conforms to specific rules of construction so that departures from these rules in the corresponding received data signal can typically be automatically detected and corrected. A main feature of an ECC is that the sender encodes messages with redundant information, which then allows the receiver to correct up to a fixed number of errors per message without retransmission. Various error-correction codes are widely used, e.g., in telecommunications and data storage.

SUMMARY OF SOME SPECIFIC EMBODIMENTS

Disclosed herein are embodiments of a low-density parity-check (LDPC) decoder comprising a pre-processor, a core decoder, and a post-processor. The pre-processor is configured to transform a received log-likelihood-ratio (LLR) sequence into a form that enables the core decoder to toggle at a reduced rate during iterative decoding processing thereof. Upon stoppage of the decoding processing corresponding to the LLR sequence, the post-processor operates to apply a complementary transformation to the output of the core decoder, which recovers the corresponding codeword of the LDPC code. An example embodiment of the LDPC decoder operating in this manner may be able to beneficially reduce the power consumption therein by about 10%.

According to an example embodiment, provided is an apparatus, comprising an optical data receiver to receive a channel-impaired data stream encoded via an LDPC code, the optical data receiver including a digital LDPC decoder comprising: (i) a pre-processor connected to receive a first sequence of LLR values representing measurements of the channel-impaired data stream, the pre-processor being configured to flip nonzero sign bits of the LLR values of the first sequence to transform the first sequence into a corresponding second LLR sequence; and (ii) an electronic decoder connected to perform iterative LDPC decoding of the second LLR sequence in response to a set of bias information corresponding to the sign-bit flips, the set of bias information being applied in the electronic decoder to change a corresponding set of parity-check conditions of the LDPC code.

According to another example embodiment, provided is a communication method, comprising the steps of: generating a first sequence of LLR values by performing, in an optical data receiver, measurements of a channel-impaired data stream encoded via an LDPC code; flipping nonzero sign bits of the LLR values of the first sequence to transform the first sequence into a corresponding second LLR sequence; and performing iterative LDPC decoding of the second LLR sequence using a set of bias information corresponding to the sign-bit flips, the set of bias information being applied to change a corresponding set of parity-check conditions of the LDPC code.

BRIEF DESCRIPTION OF THE DRAWINGS

Other aspects, features, and benefits of various disclosed embodiments will become more fully apparent, by way of example, from the following detailed description and the accompanying drawings, in which:

FIG. 3 shows a flowchart of a processing method that can be implemented using the LDPC decoder of FIG. 2 according to an embodiment;

FIG. 4 shows a simplified bipartite graph representing a message-passing decoding algorithm that can be implemented in the LDPC decoder of FIG. 2 according to an embodiment;

FIGS. 5A-5D provide pseudocode examples that can be used to program the LDPC decoder of FIG. 2 according to an embodiment;

DETAILED DESCRIPTION

A representative systematic forward-error-correction (FEC) code is used to convert an input bit sequence into an expanded bit sequence (e.g., an FEC codeword) by appending to the input bit sequence a corresponding set of parity bits. Some well-performing FEC codes are low-density parity-check (LDPC) codes. LDPC codes are linear block codes that have parity check matrices with a relatively small number of nonzero elements in each row and column. An LDPC decoder may use soft information during decoding, which information can be generated by a soft information detector, e.g., relying on a soft-output algorithm. LDPC coding is known to persons of ordinary skill in the error-correction arts and is briefly reviewed, e.g., in International Patent Application Publication No. WO 2010/019168, which is incorporated herein by reference in its entirety.

Figure 1:
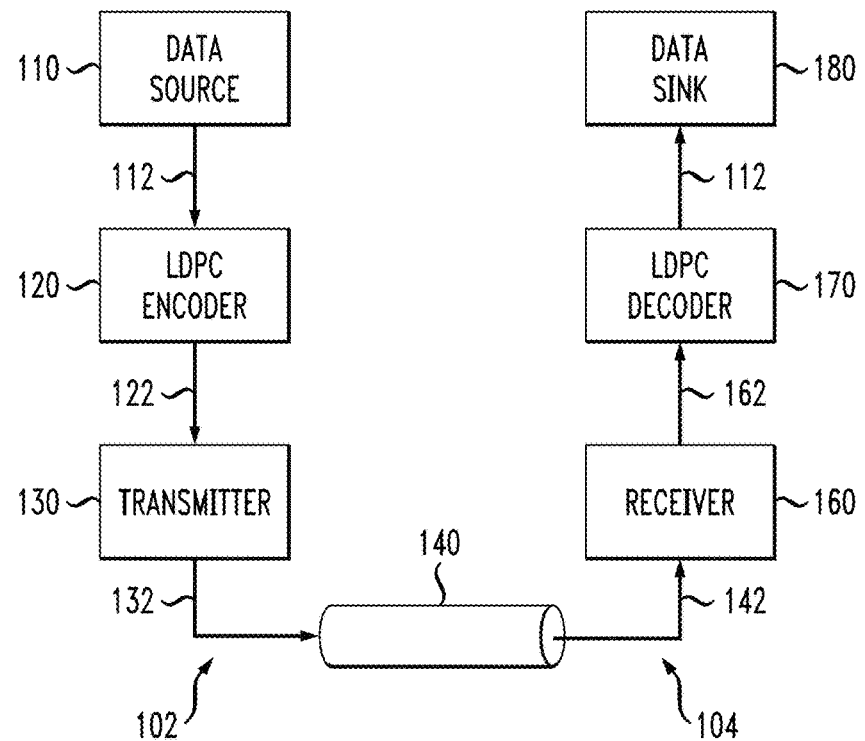
FIG. 1 shows a block diagram of a communication system in which example embodiments may be practiced.

FIG. 1 shows a block diagram of a communication system 100 in which example embodiments may be practiced. System 100 comprises a transmit branch 102, a receive branch 104, and a communication channel 140. In different embodiments, channel 140 may be, e.g., a wireline, wireless, or fiber-optic channel.

In an example embodiment, transmit branch 102 comprises a data source (e.g., input port) 110, an LDPC encoder 120, and a data transmitter 130. In operation, data source 110 may provide a set of bits 112, often referred to as an original information word, to LDPC encoder 120. LDPC encoder 120 encodes information word 112 using the operative LDPC code to generate a corresponding codeword 122. Codeword 122 is then supplied to data transmitter 130, which converts the supplied codeword into a corresponding output data signal 132 suitable for application or transmission to the physical channel 140. Data transmitter 130 then applies output data signal 132 to channel 140.

In an example embodiment, receive branch 104 comprises a data receiver 160, an LDPC decoder 170, and a data sink (e.g., output port) 180. In operation, data receiver 160 receives an input data signal 142 from channel 140. Input data signal 142 typically differs from the corresponding output data signal 132 applied or transmitted to channel 140 by transmit branch 102, e.g., due to the presence of noise and other linear and/or nonlinear signal distortions imposed by the channel, e.g., chromatic and polarization dispersion and nonlinear optical distortion. Data receiver 160 may perform measurements on input data signal 142, e.g., as known in the art, to generate a corresponding set of log-likelihood-ratio (LLR) values 162 and then supply the LLR values to LDPC decoder 170.

In an example implementation, an LLR value comprises: (i) a sign bit that represents the best guess (e.g., hard decision) regarding the bit value encoded in the corresponding portion of data signal 142; and (ii) one or more magnitude bits that represent the confidence in the hard decision. For example, data receiver 160 may output each LLR value as a five-bit value, wherein the most-significant bit (MSB) is the sign bit and the four least-significant bits (LSBs) are the confidence bits. For example, a five-bit LLR value of 00000 indicates a hard decision of 0 with the minimum confidence, while a five-bit LLR value of 01111 indicates a hard decision of 0 with the maximum confidence. Intermediate values (e.g., between 0000 and 1111) of confidence bits represent intermediate confidence levels. Similarly, a five-bit LLR value of 10000 indicates a hard decision of 1 with the minimum confidence, while a five-bit LLR value of 11111 indicates a hard decision of 1 with the maximum confidence. Other implementations and interpretations of LLR values may also be used in some embodiments.

LDPC decoder 170 performs iterative decoding on a sequence of LLR values 162 to recover the corresponding original information word 112, which is then directed to data sink 180. More specifically, the decoding processing performed in LDPC decoder 170 is directed at converting an LLR sequence 162 into a corresponding valid codeword of the operative LDPC code. A valid codeword is characterized in that all of its parity checks defined by the code's parity-check matrix are satisfied, e.g., produce zeros. In a conventional implementation, such decoding processing may include the following example steps. First, parity checks defined by the parity-check matrix are calculated. If all parity checks are satisfied, then the decoding processing is terminated, and the LDPC decoder outputs the codeword that satisfied the parity checks. If some of the parity checks are not satisfied, then the decoder typically operates to try to converge to a valid codeword of the LDPC code using an iterative process, e.g., based on a message-passing or belief-propagation algorithm. After each iteration, the decoder recalculates the parity checks and, depending on the result, may either output a valid codeword or proceed to perform another iteration. In different embodiments, different iteration-stoppage criteria may be used to end iterations.

Some embodiments of system 100 may benefit from a receive branch 104 having reduced power consumption therein. For example, in some implementations of receive branch 104 of an optical communication system 100, LDPC decoder 170 may consume approximately 50% of the power needed to run the corresponding digital signal processor (DSP) of the optical data receiver. Accordingly, power-efficient implementations of LDPC decoder 170 may especially be desirable for optical communications systems.

These and possibly other related problems in the state of the art can beneficially be addressed using at least some embodiments of LDPC decoder 170 described in more detail below in reference to FIGS. 2-5. More specifically, according to an example embodiment, LDPC decoder 170 may include a pre-processor, a core decoder, and a post-processor. The pre-processor is configured to transform the received LLR sequences 162 into a form that enables the core decoder to toggle at a reduced rate during iterative decoding processing thereof. Upon stoppage of the decoding processing corresponding to LLR sequence 162, the post-processor operates to apply a complementary transformation to the output of the core decoder, which recovers the corresponding codeword of the LDPC code.

The inventors' computer simulations indicate that an example embodiment of LDPC decoder 170 operating in this manner may be able to beneficially reduce the power consumption therein by about 10%. Since the addition of pre- and post-processors may represent a substantially insignificant increase in the circuit complexity of the LDPC decoder, such power-consumption reduction may advantageously be achieved substantially without an overall cost increase for the corresponding DSP and/or receive branch 104.

Figure 2:
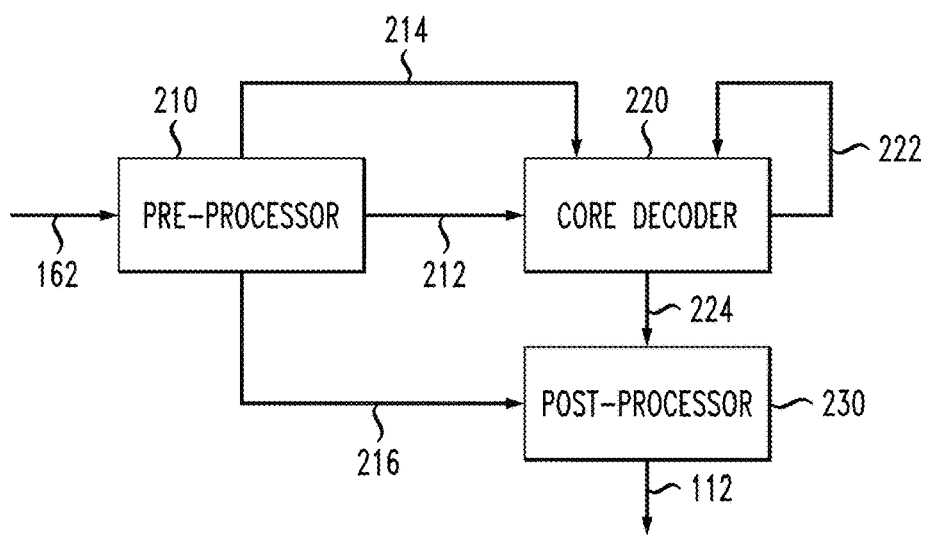
FIG. 2 shows a block diagram of a low-density parity-check (LDPC) decoder that can be used in the communication system of FIG. 1 according to an embodiment.

FIG. 2 shows a block diagram of LDPC decoder 170 according to an embodiment. As shown, LDPC decoder 170 comprises a pre-processor 210, a core decoder 220, and a post-processor 230 interconnected as indicated in FIG. 2. The stream of LLR values 162 and the stream of information words 112 are also schematically shown in FIG. 2 to better illustrate the relationship between the circuits of FIGS. 1 and 2.

The inventors believe that the average toggling rate during the decoding processing of an LLR sequence 162 in a conventional LDPC decoder may depend on the specific value of the bit-word defined by the sign bits of the sequence. That is, for some specific values of such sign bit-words, the observed average toggling rate may be significantly lower than for some other values of such sign bit-words. One of such specific values may be the null (i.e., all-zero) sign bit-word. Other examples of such specific values may be implementation- and/or code-specific, but may typically be identified, e.g., using appropriate computer simulations. Herein, sign bit-words characterized by a reduced toggling rate during decoding processing of the corresponding LLR sequences 162 are referred to as "lower-toggle" sign bit-words.

Herein, the term "toggling rate" refers to the relative rate at which a logic element switches compared to its input. For example, during the decoding processing of an LLR sequence 162 (input), some or all of the sign and confidence bits stored in the variable nodes (logic elements) of the decoder may toggle during iterations. A person of ordinary skill in the art will readily understand that, in hardware, a bit-value flip typically involves a voltage change in the corresponding memory cell, which draws electrical current and, as such, consumes electrical power. Thus, reduction in the toggling rate may produce a corresponding reduction in the power consumption.

The architecture of LDPC decoder 170 shown in FIG. 2 beneficially exploits the above-indicated features of the LDPC-decoding processing by steering the decoder towards the decoding paths associated with one or more of the lower-toggle sign bit-words. As a result, the effective toggling rate is typically reduced, thereby beneficially reducing the power consumption in LDPC decoder 170.

Pre-processor 210 operates to transform any received LLR sequence 162 into a corresponding LLR sequence 212, the sign bits of which form a selected one of the lower-toggle sign bit-words. LLR sequence 212 is then supplied to core decoder 220 together with a set 214 of the corresponding bias information. In an example embodiment, bias information 214 is constructed to inform core decoder 220 about the parity checks affected by the LLR-sequence transformation performed by pre-processor 210. Pre-processor 210 also generates a sign-inversion vector 216 corresponding to the LLR-sequence transformation performed therein and supplies this sign-inversion vector to post-processor 230. In an example embodiment, sign-inversion vector 216 is constructed to inform post-processor 230 about the LLR-sequence positions at which the sign-bit flips have been performed by pre-processor 210 during the LLR transformation.

Core decoder 220 operates to perform iterative decoding processing of LLR sequence 212 using the corresponding bias information 214. In FIG. 2, a processing loop 222 schematically indicates decoding iterations performed by core decoder 220. After each iteration 222, core decoder 220 recalculates biased parity checks and, depending on the result, may either output a corresponding biased codeword 224 or proceed to perform another iteration 222. Herein, the term "biased parity checks" refers to a set of parity-check conditions, wherein some of the conditions are altered based on bias information 214. The term "biased codeword" similarly refers to a valid codeword of the operative LDPC code, wherein some of the bits are flipped due to the use of biased parity-check conditions instead of the true parity-check conditions of the code. Example embodiments of the decoding processing performed in core decoder 220 are described in more detail below in reference to FIGS. 3 and 5C.

Post-processor 230 operates to flip the bits of biased codeword 224 at positions indicated by sign-inversion vector 216, thereby transforming the biased codeword into a corresponding valid codeword of the operative LDPC code. Post-processor 230 then uses this valid codeword to recover, in a conventional manner, the corresponding original information word 112.

FIG. 3 shows a flowchart of a processing method 300 that can be implemented using LDPC decoder 170 of FIG. 2 according to an embodiment. For illustration purposes and without any implied limitations, method 300 is described in reference to the null lower-toggle bit-word.

At step 302, pre-processor 210 receives a next LLR sequence 162 from receiver 160. The received LLR sequence 162 has N LLRs, where N is the codeword length of the operative LDPC code. In an example embodiment, the number N can be, e.g., in the range between about $10^4$ and about $10^5$. Each LLR has a sign bit and n confidence bits, where the number n can be, e.g., in the range between seven and ten. In alternative embodiments, other codeword lengths and/or LLR sizes can be used. Example power savings may depend on the choice of these parameters.

At step 304, pre-processor 210 operates to transform LLR sequence 162 received at step 302 into a corresponding LLR sequence 212, wherein the sign bits form the null bit-word.

At step 306, pre-processor 210 generates bias information 214 and sign-inversion vector 216 corresponding to the transformation of step 304.

At step 308, core decoder 220 performs a next decoding iteration 222 for the LLR sequence 212 of step 304 using the bias information 214 of step 306. In the first instance of step 308, core decoder 220 performs the initial decoding iteration.

Step 310 is used to control the exit from the iteration loop 222. More specifically, if the iteration stoppage criteria are not satisfied, then the processing of method 300 is looped back for another instance of step 308. Otherwise, the processing of method 300 is directed to step 312. In some embodiments of step 310, conventional iteration-stoppage criteria known to persons of ordinary skill in the LDPC coding/decoding arts may be used.

At step 312, post-processor 230 recovers the original information word 112 corresponding to the LLR sequence 162 of step 302 based on the biased codeword 224 generated during the last instance of step 308 and the sign-inversion vector 216 of step 306. Step 312 may typically include the sub-steps of (i) converting the biased codeword 224 into a corresponding valid codeword of the LDPC code and (ii) recovering the original information word 112 from the valid codeword.

Step 314 is used to control the termination of method 300. More specifically, if there is another LLR sequence 162 in the decoding queue, then the processing of method 300 is directed back to step 302. Otherwise, the processing of method 300 is terminated.

FIG. 4 shows a simplified bipartite graph 400 representing a message-passing decoding algorithm that can be implemented in core decoder 220 according to an embodiment. For illustration purposes and without any implied limitations, graph 400 is shown as having five channel nodes $402_1$-$402_5$, five variable nodes labeled $410_1$-$410_5$, and four check nodes labeled $420_1$-$420_4$. In general, the full bipartite graph for an LDPC decoder has N variable nodes and (N-r) check nodes, where N is the codeword length of the LDPC code, and r is the length of the corresponding information word, e.g., 112, FIGS. 1-2. Connected variable nodes 410 and check nodes 420 can exchange messages during iterative decoding. The connections through which such messages are passed between the nodes are typically referred to as the "edges" of the graph. The positions of the edges between the nodes are determined by the nonzero elements of the code's parity-check matrix. In an example embodiment, the parity-check matrix may have (N-r) rows and N columns. If the parity-check matrix has a nonzero element located in the i-th column and j-th row, then the corresponding bipartite graph has an edge connecting the i-th variable node and the j-th check node. The bipartite graph does not typically have edges corresponding to any zero elements of the parity-check matrix.

The variable nodes are initialized by the channel nodes, using LLR sequence 212. As an example, FIG. 4 shows LLRs $212_1$-$212_5$ of the LLR sequence 212 as being applied to channel nodes $402_1$-$402_5$, respectively. During iterative decoding processing, the LLR values stored in the variable nodes are recomputed based on the messages exchanged, through the edges of the graph, by the corresponding variable and check nodes.

Each of the check nodes operates to compute, modulo two, the sum of the inputs applied thereto by the connected nodes (also see FIGS. 5A-5D). In a conventional implementation of the LDPC decoder, the check nodes may only receive inputs from the connected variable nodes, which causes each of the check nodes to compute the corresponding one of the parity checks of the LDPC code. In contrast, in core decoder 220, each of check nodes 420 is also connected to receive an input from a respective one of bias nodes 430. In an example embodiment, there is the same number of check and bias nodes, i.e., (N-r) of each. As such, FIG. 4 illustratively shows four bias nodes 430, labeled $430_1$-$430_4$, each of which is connected to provide a corresponding additional input to a respective one of check nodes $420_1$-$420_4$. Each of these additional inputs is fixed for each LLR sequence 212 that is being processed and does not change during iterative decoding thereof. More specifically, each of bias nodes 430 is loaded with a respective bias value computed based on the bias information 214 provided by pre-processor 210. As such, FIG. 4 illustratively shows bias nodes $430_1$-$430_4$ as providing inputs $214_1$-$214_4$ to check nodes $420_1$-$420_4$, respectively. As a result, check nodes $420_1$-$420_4$ operate to compute the corresponding biased parity checks for each iteration 222, as already indicated above. A person of ordinary skill in the art will readily understand that different LLR sequences 162 may typically result in different respective sets of inputs $214_1$-$214_4$.

In an example embodiment, core decoder 220 may operate in substantially the same manner as a conventional LDPC decoder to exchange messages, by way of the edges of graph 400, between the connected variable nodes 410 and check nodes 420. However, the processing performed by at least some of the check nodes 420 may be different from that of the check nodes in a conventional LDPC decoder, e.g., due to the use of inputs $214_1$-$214_4$, e.g., as described in more detail below in reference to FIGS. 5A-5D.

FIGS. 5A-5D provide pseudocode examples that can be used to program LDPC decoder 170 according to an embodiment. More specifically, FIG. 5A provides the nomenclature and various definitions relevant to the pseudocodes of FIGS. 5B-5D. FIGS. 5B-5D provide pseudocode examples for programming pre-processor 210, core decoder 220, and post-processor 230, respectively. The pseudocode of FIG. 5B generally corresponds to steps 304-306 of method 300. The pseudocode of FIG. 5C generally corresponds to step 308 of method 300. The pseudocode of FIG. 5D generally corresponds to step 312 of method 300.

Referring to FIG. 5B, lines 501-505 cause pre-processor 210 to flip the sign bits of any negative LLR values present in the received LLR sequence 212. Lines 506-509 cause pre-processor 210 to set to zero the initial values of the messages. Line 510 sets the initial component values of bias vector 214 to be all zeros. Lines 511-517 cause pre-processor 210 to adjust the bias vector 214 and compute the sign-inversion vector 216 to reflect the sign-bit flips performed at lines 501-505.

Referring to FIG. 5C, lines 520-528 represent a single iteration 222 performed by core decoder 220. Depending on the decisions taken at step 310 of method 300, the processing represented by lines 520-528 may be repeated one or more times. Lines 520-522 cause core decoder 220 to compute messages from variable nodes 410 to check nodes 420. Lines 523-525 cause core decoder 220 to compute messages from check nodes 420 to variable nodes 410. Lines 526-528 cause core decoder 220 to update the LLR values in the variable nodes 410 based on the messages. Therein, line 528 makes the hard decision for the potential readout.

Referring to FIG. 5D, lines 530-531 cause post-processor 230 to adjust the hard decision corresponding to line 528 (FIG. 5C) based on the sign-inversion vector 216.

Figure 6:
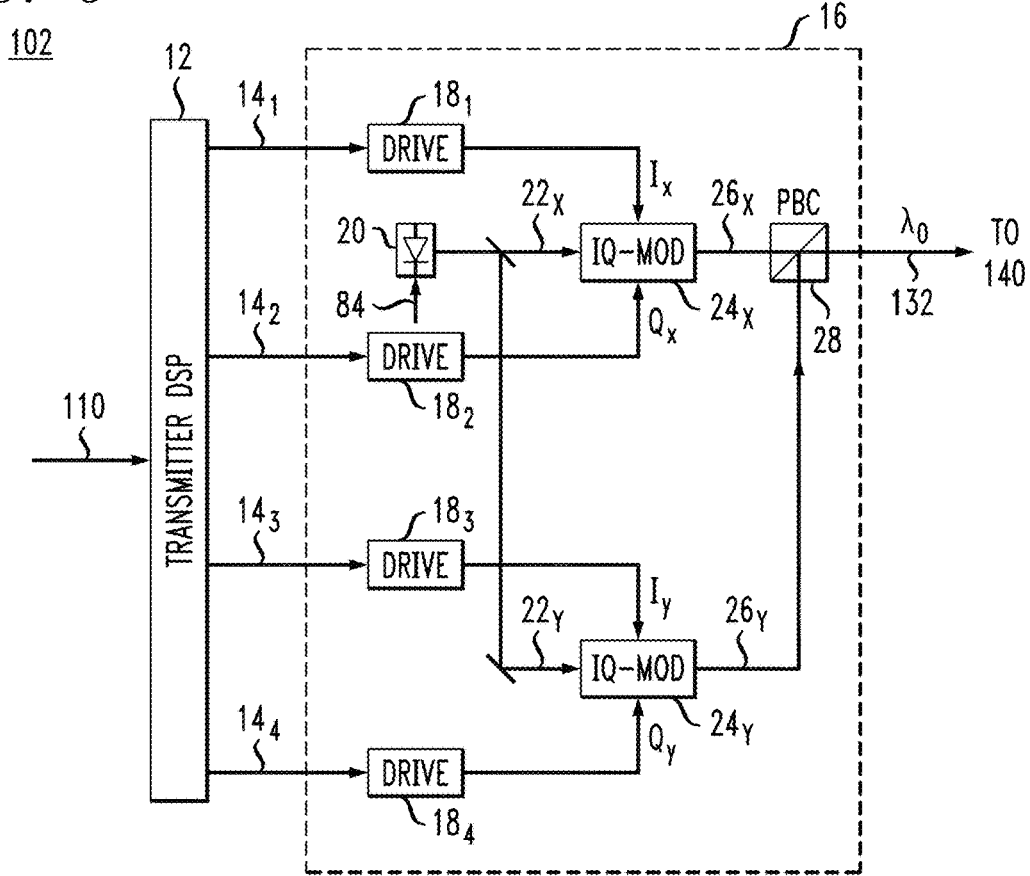
FIG. 6 shows a block diagram of an optical data transmitter that can be used in the communication system of FIG. 1 according to an embodiment.

FIG. 6 shows a block diagram of an optical data transmitter that can be used to implement transmit branch 102 of system 100 (FIG. 1) according to an embodiment. In this embodiment, communication channel 140 is a fiber-optic channel.

Transmitter 102 comprises a DSP 12 connected to data source 110. DSP 12 comprises LDPC encoder 120 (not explicitly shown in FIG. 6). In operation, DSP 12 processes an input data stream supplied by data source 110 to generate digital signals $14_1$-$14_4$. In an example embodiment, DSP 12 may perform, inter alia, one or more of the following: (i) encode the input data stream using a suitable code, e.g., including an LDPC code; (ii) parse the resulting encoded data stream into a sequence of bit-words; (iii) for each bit-word, determine a corresponding constellation symbol of the operative QAM constellation; (iv) generate a digital drive signal carrying the constellation symbol. For example, in each modulation time slot, signals $14_1$ and $14_2$ may carry digital values that represent the I component and Q component, respectively, of a QAM constellation symbol intended for transmission using a first (e.g., X) polarization of light. Signals $14_3$ and $14_4$ may similarly carry digital values that represent the I and Q components, respectively, of a QAM constellation symbol intended for transmission using a second (e.g., Y) polarization of light.

A front-end circuit 16 of transmitter 102 is an electrical-to-optical (E/O) converter that operates to transform digital signals $14_1$-$14_4$ into a corresponding modulated optical output signal 30. More specifically, drive circuits $18_1$ and $18_2$ transform digital signals $14_1$ and $14_2$, as known in the pertinent art, into electrical analog drive signals $I_X$ and $Q_X$, respectively. Drive signals $I_X$ and $Q_X$ are then used, in a conventional manner, to drive an optical I-Q modulator $24_X$. In response to drive signals $I_X$ and $Q_X$, optical I-Q modulator $24_X$ operates to modulate an X-polarized beam $22_X$ of light supplied thereto by a laser source 20 as indicated in FIG. 6, thereby generating a modulated optical signal $26_X$.

The output wavelength of laser source 20 is wavelength $\lambda_0$. The optical output power of laser source 20 can be set and/or changed in response to a control signal 84.

Drive circuits $18_3$ and $18_4$ similarly transform digital signals $14_3$ and $14_4$ into electrical analog drive signals $I_Y$ and $Q_Y$, respectively. In response to drive signals $I_Y$ and $Q_Y$, an optical I-Q modulator $24_Y$ operates to modulate a Y-polarized beam $22_Y$ of light supplied by laser source 20 as indicated in FIG. 6, thereby generating a modulated optical signal $26_Y$. A polarization beam combiner (PBC) 28 operates to combine modulated optical signals $26_X$ and $26_Y$, thereby generating the optical output signal 132, said optical output signal being a polarization-division-multiplexed (PDM) signal. Optical output signal 30 may then be directed for transmission to optical fiber 140.

Figure 7:
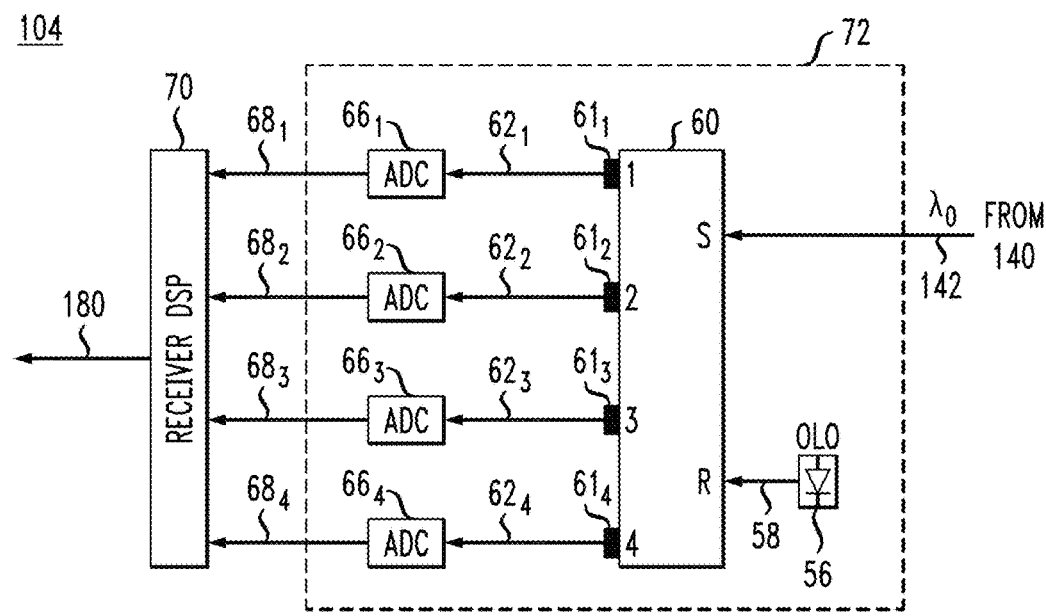
FIG. 7 shows a block diagram of an optical data receiver that can be used in the communication system of FIG. 1 according to an embodiment.

FIG. 7 shows a block diagram of an optical data receiver that can be used to implement receive branch 104 of system 100 (FIG. 1) according to an embodiment. The shown optical data receiver 104 is compatible with optical data transmitter 102 of FIG. 6.

A front-end circuit 72 of receiver 104 is an optical-to-electrical (O/E) converter comprising an optical hybrid 60, light detectors $61_1$-$61_4$, analog-to-digital converters (ADCs) $66_1$-$66_4$, and an optical local-oscillator (OLO) source 56. Optical hybrid 60 has (i) two input ports labeled S and R and (ii) four output ports labeled 1 through 4. Input port S receives optical signal 142 from optical fiber 140. Input port R receives an OLO signal 58 generated by OLO source (e.g., laser) 56. OLO signal 58 has an optical-carrier wavelength (frequency) that is sufficiently close to that of signal 30 to enable coherent (e.g., intradyne) detection of the latter optical signal.

In an example embodiment, optical hybrid 60 operates to mix optical signal 142 and OLO signal 58 to generate different mixed (e.g., by interference) optical signals (not explicitly shown in FIG. 7). Light detectors $61_1$-$61_4$ then convert the mixed optical signals into four electrical signals $62_1$-$62_4$ that are indicative of complex values corresponding to two orthogonal-polarization components of optical signal 142. For example, electrical signals $62_1$ and $62_2$ may be indicative of an analog I signal and an analog Q signal, respectively, or linearly independent mixtures thereof corresponding to a first (e.g., horizontal, h) polarization component of optical signal 142. Electrical signals $62_3$ and $62_4$ may similarly be indicative of an analog I signal and an analog Q signal, respectively, or linearly independent mixtures thereof corresponding to a second (e.g., vertical, v) polarization component of optical signal 142.

Each of electrical signals $62_1$-$62_4$ is converted into digital form in a corresponding one of ADCs $66_1$-$66_4$. Optionally, each of electrical signals $62_1$-$62_4$ may be low-pass filtered and amplified in a corresponding electrical amplifier (not explicitly shown) prior to the resulting signal being converted into digital form. Digital signals $68_1$-$68_4$ produced by ADCs $66_1$-$66_4$, respectively, are then processed by a DSP 70. DSP 70 comprises LDPC decoder 170 (not explicitly shown in FIG. 7).

In an example embodiment, DSP 70 may perform, inter alia, one or more of the following: (i) signal processing directed at dispersion compensation; (ii) signal processing directed at compensation of nonlinear distortions; (iii) electronic compensation for polarization rotation and polarization de-multiplexing; (iv) compensation of frequency offset between OLO 56 and laser source 20; (v) error correction based on LDPC-encoding performed at DSP 12; (vi) mapping of a set of complex values conveyed by digital signals $68_1$-$68_4$ onto the operative QAM constellations to determine a corresponding constellation symbol thereof, etc. An output data stream of DSP 70 is applied to data sink 180.

According to an example embodiment disclosed above, e.g., in the summary section and/or in reference to any one or any combination of some or all of FIGS. 1-7, provided is an apparatus, comprising an optical data receiver (e.g., 104, FIG. 1) to receive a channel-impaired data stream (e.g., 142, FIG. 1) encoded via a low-density parity-check, LDPC, code, the optical data receiver including a digital LDPC decoder (e.g., 170, FIG. 1) comprising: (i) a pre-processor (e.g., 210, FIG. 2) connected to receive a first sequence of log-likelihood-ratio, LLR, values (e.g., 162, FIG. 2) representing measurements of the channel-impaired data stream, the pre-processor being configured to flip (e.g., 304, FIG. 3) nonzero sign bits of the LLR values of the first sequence to transform the first sequence into a corresponding second LLR sequence (e.g., 212, FIG. 2); and (ii) an electronic decoder (e.g., 220, FIG. 2) connected to perform iterative LDPC decoding (e.g., 308-310, FIG. 3) of the second LLR sequence in response to a set of bias information (e.g., 214, FIG. 2) corresponding to the sign-bit flips, the set of bias information being applied in the electronic decoder to change a corresponding set of parity-check conditions of the LDPC code.

In some embodiments of the above apparatus, the digital LDPC decoder further comprises a post-processor (e.g., 230, FIG. 2) configured to obtain (e.g., 530-531, FIG. 5D) a codeword of the LDPC code corresponding to the first sequence by flipping bits of a hard decision at bit positions corresponding to positions of the sign-bit flips in the first sequence, the hard decision being taken upon stoppage of the iterative LDPC decoding (e.g., "Yes" at 310, FIG. 3).

In some embodiments of any of the above apparatus, the digital LDPC decoder is configured to recover (e.g., 312, FIG. 3), based on the codeword, a corresponding information word encoded in the channel-impaired data stream.

In some embodiments of any of the above apparatus, the digital LDPC decoder is configured to perform the iterative LDPC decoding by updating messages for variable nodes (e.g., 410, FIG. 4) and check nodes (e.g., 420, FIG. 4) thereof.

In some embodiments of any of the above apparatus, the set of bias information (e.g., $214_1$-$214_4$, FIG. 4) is applied to a corresponding set of the check nodes to change the parity-check conditions computed thereat.

In some embodiments of any of the above apparatus, individual ones of the variable nodes are initialized using respective LLR values (e.g., $212_1$-$212_5$, FIG. 4) of the second LLR sequence.

In some embodiments of any of the above apparatus, the optical data receiver comprises one or more photodiodes (e.g., $61_1$-$61_4$, FIG. 7) to receive the channel-impaired data stream.

According to another example embodiment disclosed above, e.g., in the summary section and/or in reference to any one or any combination of some or all of FIGS. 1-7, provided is a communication method, comprising the steps of: generating a first sequence of log-likelihood-ratio, LLR, values (e.g., 162, FIG. 2) by performing, in an optical data receiver (e.g., 104, FIG. 1), measurements of a channel-impaired data stream (e.g., 142, FIG. 1) encoded via a low-density parity-check, LDPC, code; flipping (e.g., 304, FIG. 3) nonzero sign bits of the LLR values of the first sequence to transform the first sequence into a corresponding second LLR sequence (e.g., 212, FIG. 2); and performing iterative LDPC decoding (e.g., 308-310, FIG. 3) of the second LLR sequence using a set of bias information (e.g., 214, FIG. 2) corresponding to the sign-bit flips, the set of bias information being applied (e.g., to 420, FIG. 4) to change a corresponding set of parity-check conditions of the LDPC code.

In some embodiments of the above method, the method further comprises obtaining (e.g., 530-531, FIG. 5D) a codeword of the LDPC code corresponding to the first sequence by flipping bits of a hard decision at bit positions corresponding to positions of the sign-bit flips in the first sequence, the hard decision being taken upon stoppage of the iterative LDPC decoding (e.g., "Yes" at 310, FIG. 3).

In some embodiments of any of the above methods, the method further comprises recovering (e.g., 312, FIG. 3), based on the codeword, a corresponding information word encoded in the channel-impaired data stream.

In some embodiments of any of the above methods, the performing comprises passing messages between variable nodes (e.g., 410, FIG. 4) and check nodes (e.g., 420, FIG. 4) of an LDPC decoder.

In some embodiments of any of the above methods, the performing further comprises applying the set of bias information (e.g., $214_1$-$214_4$, FIG. 4) to a corresponding set of the check nodes to change the parity-check conditions computed thereat.

In some embodiments of any of the above methods, individual ones of the variable nodes are initialized using respective LLR values (e.g., $212_1$-$212_5$, FIG. 4) of the second LLR sequence.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Unless otherwise specified herein, in addition to its plain meaning, the conjunction "if" may also or alternatively be construed to mean "when" or "upon" or "in response to determining" or "in response to detecting," which construal may depend on the corresponding specific context. For example, the phrase "if it is determined" or "if [a stated condition] is detected" may be construed to mean "upon determining" or "in response to determining" or "upon detecting [the stated condition or event]" or "in response to detecting [the stated condition or event]."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

A person of ordinary skill in the art would readily recognize that steps of various above-described methods can be performed by programmed computers. Herein, some embodiments are intended to cover program storage devices, e.g., digital data storage media, which are machine or computer readable and encode machine-executable or computer-executable programs of instructions where said instructions perform some or all of the steps of methods described herein. The program storage devices may be, e.g., digital memories, magnetic storage media such as a magnetic disks or tapes, hard drives, or optically readable digital data storage media. The embodiments are also intended to cover computers programmed to perform said steps of methods described herein.

The description and drawings merely illustrate the principles of the disclosure. It will thus be appreciated that those of ordinary skill in the art will be able to devise various arrangements that, although not explicitly described or shown herein, embody the principles of the disclosure and are included within its scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled as "processors" and/or "controllers," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It should be appreciated by those of ordinary skill in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

"SUMMARY OF SOME SPECIFIC EMBODIMENTS" in this specification is intended to introduce some example embodiments, with additional embodiments being described in "DETAILED DESCRIPTION" and/or in reference to one or more drawings. "SUMMARY OF SOME SPECIFIC EMBODIMENTS" is not intended to identify essential elements or features of the claimed subject matter, nor is it intended to limit the scope of the claimed subject matter.

What is claimed is:

1. An apparatus, comprising:
   an optical data receiver to receive a channel-impaired data stream encoded via a low-density parity-check (LDPC) code, the optical data receiver including a digital LDPC decoder comprising:
   a pre-processor connected to receive a first sequence of log-likelihood-ratio (LLR) values representing measurements of the channel-impaired data stream, the pre-processor being configured to flip nonzero sign bits of the LLR values of the first sequence to transform the first sequence into a corresponding second LLR sequence; and
   an electronic decoder connected to perform iterative LDPC decoding of the second LLR sequence in response to a set of bias information corresponding to the sign-bit flips, the set of bias information being applied in the electronic decoder to change a corresponding set of parity-check conditions of the LDPC code.

2. The apparatus of claim 1, wherein the optical data receiver comprises one or more photodiodes.

3. The apparatus of claim 1, wherein the digital LDPC decoder further comprises a post-processor configured to obtain a codeword of the LDPC code corresponding to the first sequence by flipping bits of a hard decision at bit positions corresponding to positions of the sign-bit flips in the first sequence, the hard decision being taken upon stoppage of the iterative LDPC decoding.

4. The apparatus of claim 3, wherein the optical data receiver comprises one or more photodiodes.

5. The apparatus of claim 3, wherein the digital LDPC decoder is configured to recover, based on the codeword, a corresponding information word encoded in the channel-impaired data stream.

6. The apparatus of claim 1, wherein the digital LDPC decoder is configured to perform the iterative LDPC decoding by updating messages for variable nodes and check nodes thereof.

7. The apparatus of claim 6, wherein the set of bias information is applied to a corresponding set of the check nodes to change the parity-check conditions computed thereat.

8. The apparatus of claim 6, wherein individual ones of the variable nodes are initialized using respective LLR values of the second LLR sequence.

9. The apparatus of claim 6, wherein the optical data receiver comprises one or more photodiodes to receive the channel-impaired data stream.

10. The apparatus of claim 7, wherein individual ones of the variable nodes are initialized using respective LLR values of the second LLR sequence.

11. The apparatus of claim 1, wherein the optical data receiver comprises:
    an optical to electrical (O/E) converter; and
    a digital signal processing hardware coupled to the O/E converter and comprising the digital LDPC decoder.

12. A communication method, comprising:
    generating a first sequence of log-likelihood-ratio (LLR) values by performing, in an optical data receiver, measurements of a channel-impaired data stream encoded via a low-density parity-check (LDPC) code; and
    flipping nonzero sign bits of the LLR values of the first sequence to transform the first sequence into a corresponding second LLR sequence; and
    performing iterative LDPC decoding of the second LLR sequence using a set of bias information corresponding to the sign-bit flips, the set of bias information being applied to change a corresponding set of parity-check conditions of the LDPC code.

13. The method of claim 12, further comprising obtaining a codeword of the LDPC code corresponding to the first sequence by flipping bits of a hard decision at bit positions corresponding to positions of the sign-bit flips in the first sequence, the hard decision being taken upon stoppage of the iterative LDPC decoding.

14. The method of claim 13, further comprising recovering, based on the codeword, a corresponding information word encoded in the channel-impaired data stream.

15. The method of claim 12, wherein the performing comprises passing messages between variable nodes and check nodes of an LDPC decoder.

16. The method of claim 15, wherein the performing further comprises applying the set of bias information to a corresponding set of the check nodes to change the parity-check conditions computed thereat.

17. The method of claim 15, wherein individual ones of the variable nodes are initialized using respective LLR values of the second LLR sequence.

18. The method of claim 16, wherein individual ones of the variable nodes are initialized using respective LLR values of the second LLR sequence.

19. The method of claim 12, comprising receiving, from an optical fiber link by the optical data receiver, an optical signal comprising the channel-impaired data stream.

* * * * *